United States Patent
Chen et al.

(10) Patent No.: US 11,728,405 B2
(45) Date of Patent: Aug. 15, 2023

(54) STRESS-INDUCING SILICON LINER IN SEMICONDUCTOR DEVICES

(71) Applicant: Taiwan Semiconductor Manufacturing Co., Ltd., Hsin-Chu (TW)

(72) Inventors: Bwo-Ning Chen, Keelung (TW); Xusheng Wu, Hsinchu (TW); Chang-Miao Liu, Hsinchu (TW); Shih-Hao Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 23 days.

(21) Appl. No.: 16/820,175

(22) Filed: Mar. 16, 2020

(65) Prior Publication Data
US 2021/0098603 A1    Apr. 1, 2021

Related U.S. Application Data

(60) Provisional application No. 62/907,564, filed on Sep. 28, 2019.

(51) Int. Cl.
| | | |
|---|---|---|
| *H01L 29/66* | (2006.01) | |
| *H01L 29/06* | (2006.01) | |
| *H01L 29/78* | (2006.01) | |
| *H01L 21/02* | (2006.01) | |
| *H01L 21/768* | (2006.01) | |
| *H01L 29/165* | (2006.01) | |

(52) U.S. Cl.
CPC .. *H01L 29/66545* (2013.01); *H01L 21/02532* (2013.01); *H01L 21/02576* (2013.01); *H01L 21/02579* (2013.01); *H01L 21/76832* (2013.01); *H01L 29/0649* (2013.01); *H01L 29/165* (2013.01); *H01L 29/6656* (2013.01); *H01L 29/7848* (2013.01)

(58) Field of Classification Search
CPC ......... H01L 21/823814; H01L 29/7848; H01L 29/66545; H01L 21/823807; H01L 29/66795; H01L 29/41791
See application file for complete search history.

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |

(Continued)

*Primary Examiner* — Julio J Maldonado
*Assistant Examiner* — Stanetta D Isaac
(74) *Attorney, Agent, or Firm* — Haynes and Boone, LLP

(57) ABSTRACT

A semiconductor structure includes source/drain (S/D) features disposed over a semiconductor substrate, a metal gate stack disposed between the S/D features, where the metal gate stack traverses a channel region between the S/D features, gate spacers disposed on sidewalls of the metal gate stack, and an etch-stop layer (ESL) disposed over the gate spacers and the S/D features. The semiconductor structure further includes an oxide liner disposed on the ESL, where the oxide liner includes silicon oxide and silicon dioxide, and an interlayer dielectric (ILD) layer disposed on the oxide liner, where composition of the ILD layer is different from composition of the oxide liner.

20 Claims, 10 Drawing Sheets

(56) References Cited

U.S. PATENT DOCUMENTS

| | | |
|---|---|---|
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 9,991,363 B1 * | 6/2018 | Huang .............. H01L 21/76829 |
| 2009/0289306 A1 * | 11/2009 | Watanabe ....... H01L 21/823807 |
| | | 257/E27.06 |
| 2018/0337188 A1 * | 11/2018 | Yu .................... H01L 21/26513 |

* cited by examiner

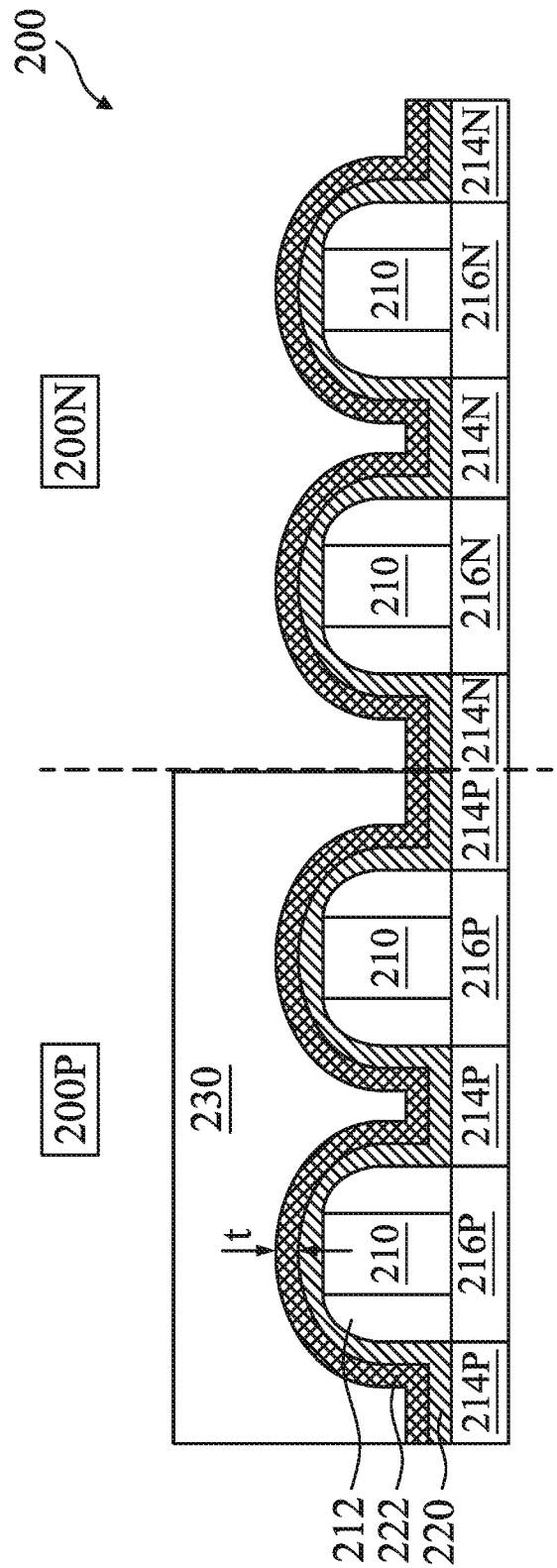
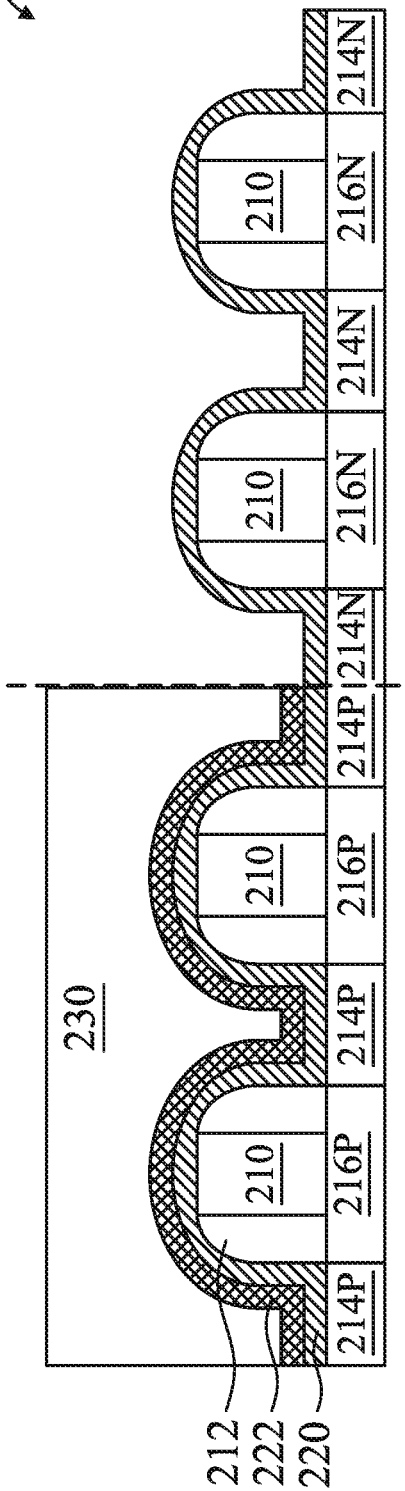

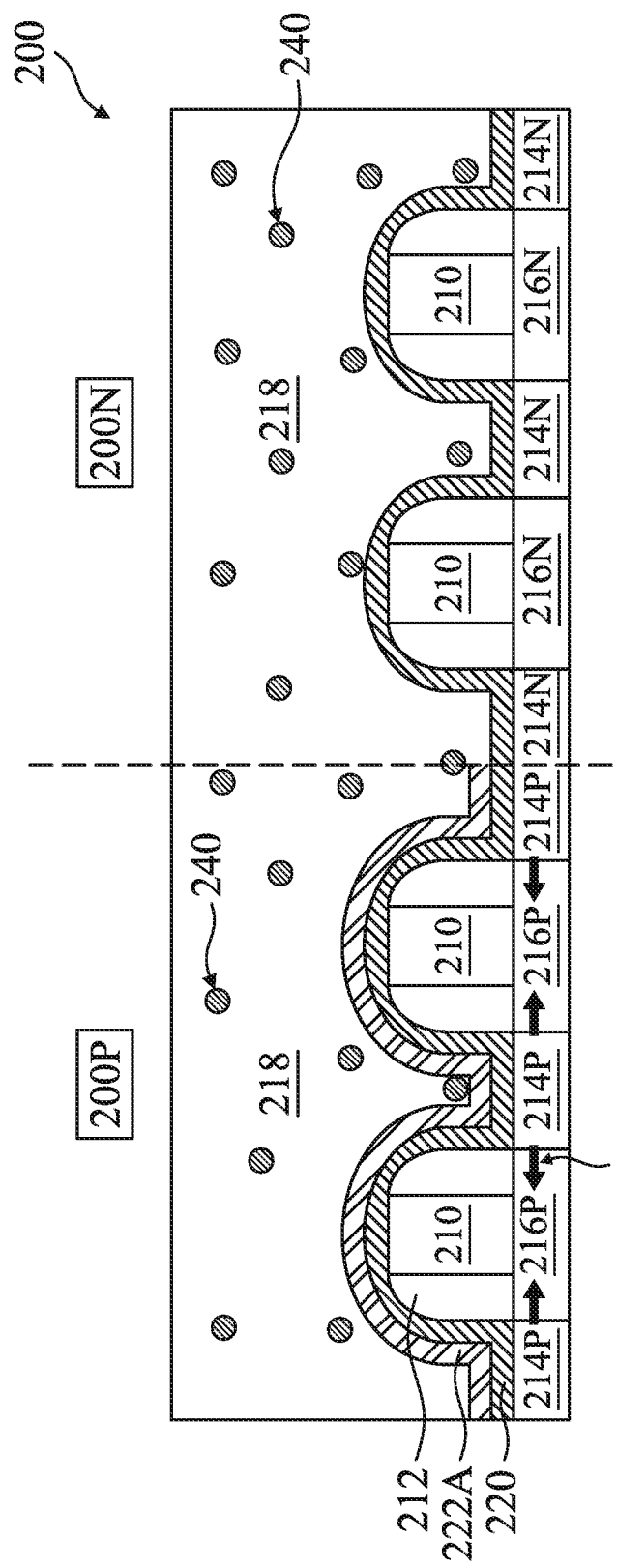
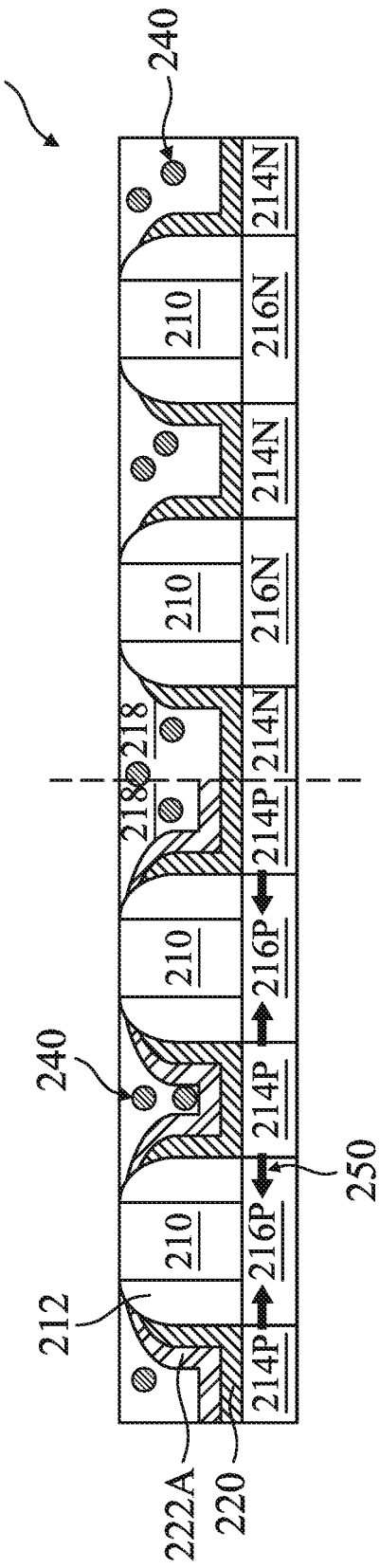
FIG. 6
FIG. 7

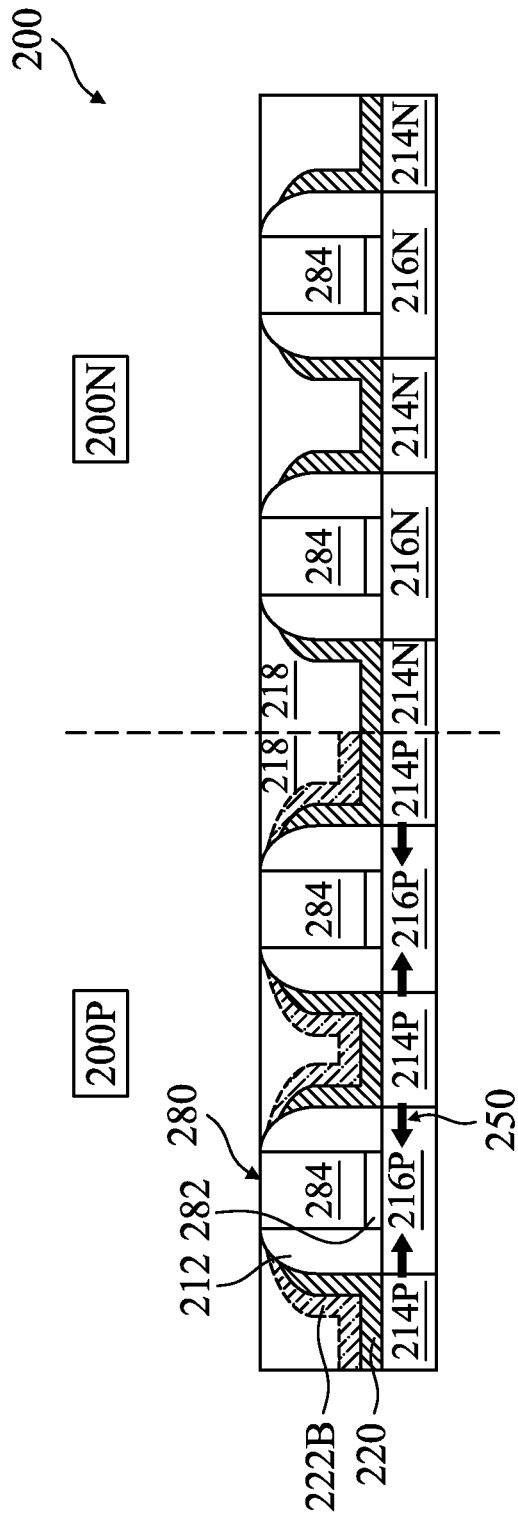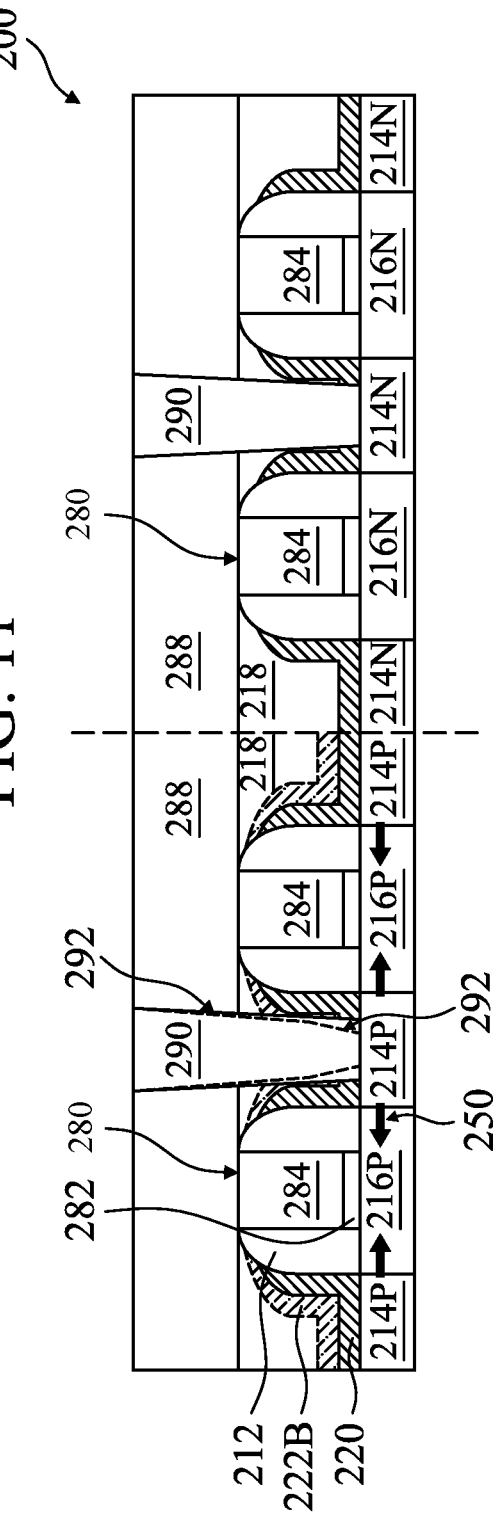

STRESS-INDUCING SILICON LINER IN SEMICONDUCTOR DEVICES

CROSS-REFERENCE TO RELATED APPLICATIONS

This is a non-provisional application of and claims priority to U.S. Provisional Patent Application Ser. No. 62/907,564, filed on Sep. 28, 2019, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For these advances to be realized, similar developments in IC processing and manufacturing are needed. For example, various methods including applying mechanical stress to a channel region of a semiconductor device (e.g., a field-effect transistor, or FET) have been developed to improve carrier mobility in such device. While they have been generally adequate, they have not been satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 4, 5, 6, 7, 8, 9, 10, 11, and 12 show cross-sectional views taken along line A-A' of the semiconductor structure of FIGS. 2A and/or 2B during intermediate steps of implementing an embodiment of the method of FIGS. 1A and 1B according to aspects of the present disclosure.

DETAILED DESCRIPTION

Figure 1A:
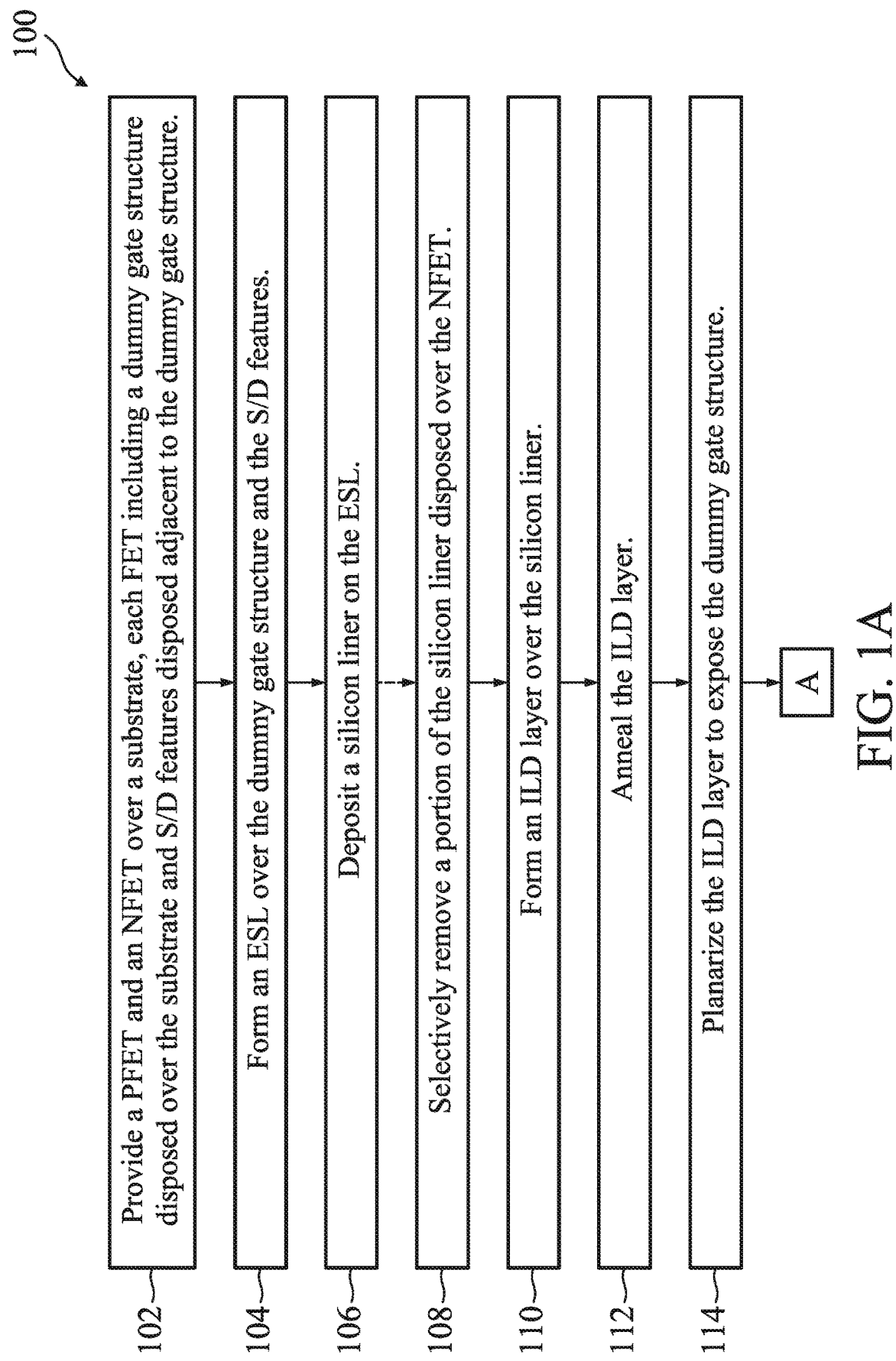
FIGS. 1A and 1B together illustrate a flow chart of a method for forming a semiconductor structure or a portion thereof according to aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices and fabrication methods, and more particularly to stress-inducing silicon liners for improving carrier mobility in semiconductor devices.

Various methods have been developed and implemented to improve performance of semiconductor devices. One example aspect of such improvement includes applying mechanical stress to a channel region of a device, thereby increasing the carrier mobility of such device. While many existing methods of applying mechanical stress have been generally adequate, they have not been entirely satisfactory in all aspects.

Figure 1B:
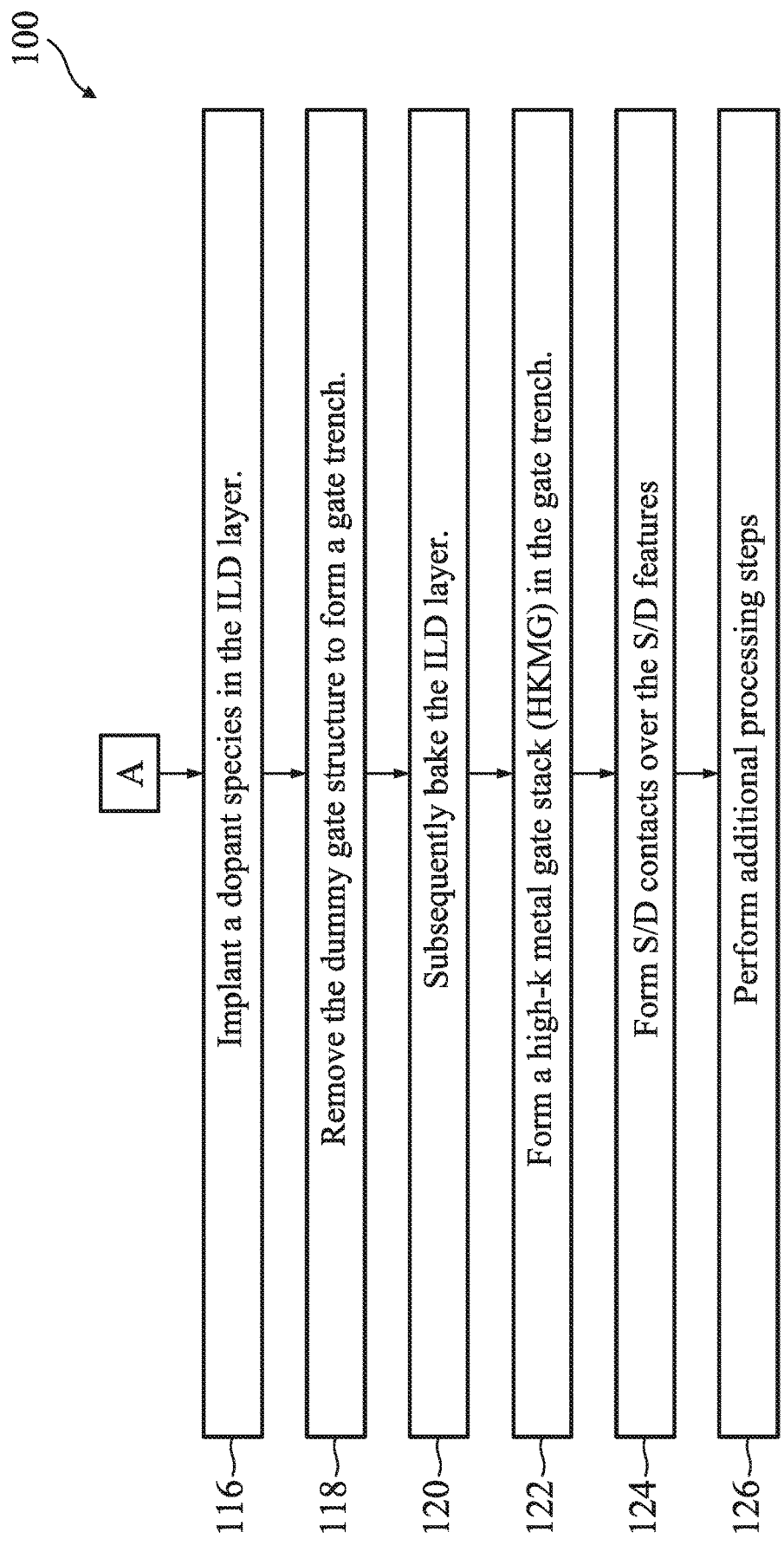

FIGS. 1A and 1B together illustrate processing flow of a method 100 for forming a device 200 in accordance with some embodiments of the present disclosure. The method 100 is merely an example and is not intended to limit the present disclosure beyond what is explicitly recited in the claims. Additional operations can be performed before, during, and after the method 100, and some operations described can be replaced, eliminated, or moved around for additional embodiments of the method. The method 100 is described below in conjunction with FIGS. 2A to 12. For purposes of simplicity, portions of the device 200 including fins 204 and substrate 202 are omitted in FIGS. 3-12 to highlight effects of the intermediate steps of the method 100 on the device 200.

The device 200 may be an intermediate device fabricated during processing of an IC, or a portion thereof, that may include static random-access memory (SRAM) and/or other logic circuits, passive components such as resistors, capacitors, and inductors, and active components such as p-type FETs (PFETs), n-type FETs (NFETs), FinFETs, multi-gate FETs (e.g., gate-all-around, or GAA, FETs), metal-oxide semiconductor field effect transistors (MOSFETs), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations. For example, though the device 200 as illustrated is a three-dimensional FinFET device, the present disclosure may also provide embodiments for fabricating planar FET devices or multi-gate devices. Additional features can be added to the device 200, and some of the features described below can be replaced, modified, or eliminated in other embodiments of the device 200.

Figures 2A, 2B:
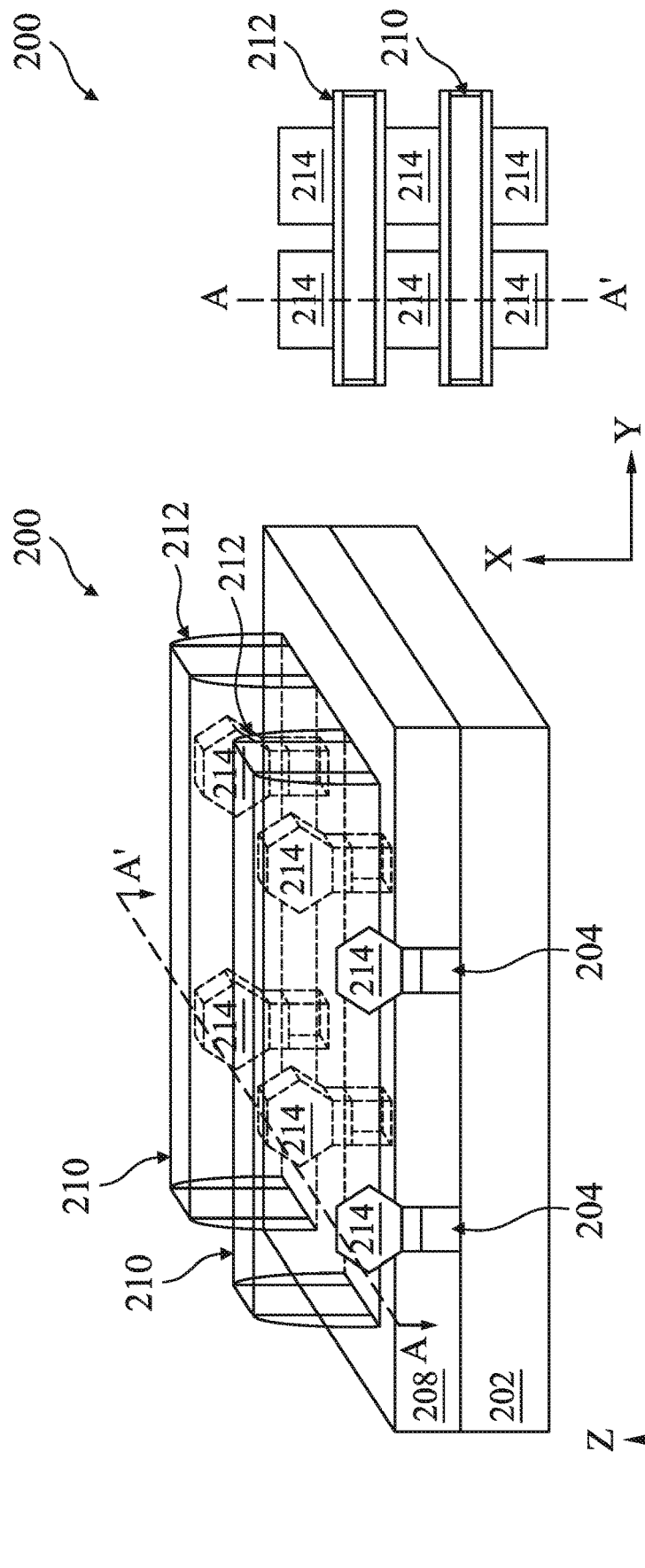
FIG. 2A shows a three-dimensional perspective view of a semiconductor structure implemented with an embodiment of the method of FIGS. 1A and 1B according to aspects of the present disclosure.
FIG. 2B shows a planar top view of the semiconductor structure of FIG. 2A according to aspects of the present disclosure.
Figure 3:
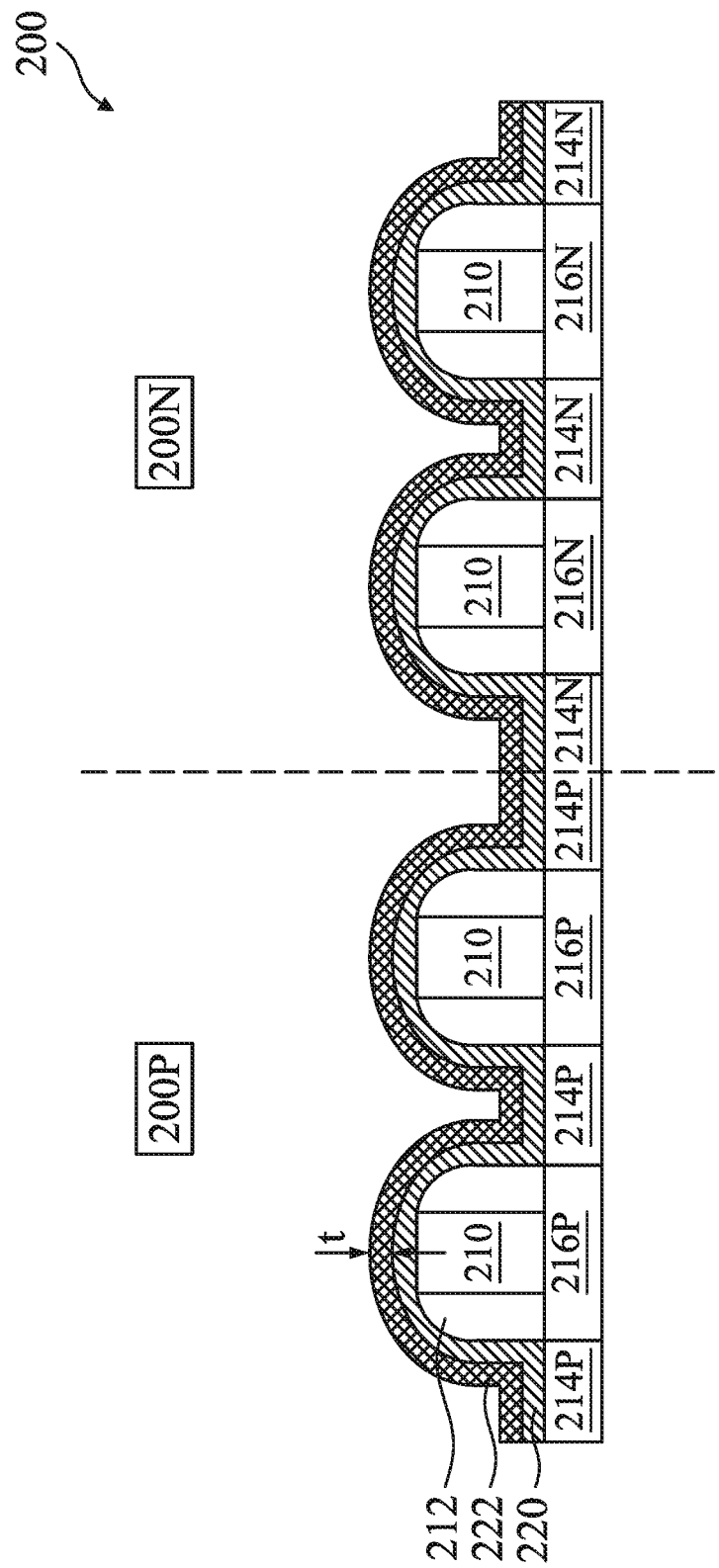

At operation 102, referring to FIGS. 1A, 2A, 2B, and 3, the method 100 provides, or is provided with, the device 200 that includes a substrate 202 having at least one semiconductor layer 204 (e.g., an active region such as a three-dimensional fin; hereafter referred to as a fin 204) disposed thereon, isolation structures 208 disposed over the substrate 202 separating various components of the device 200, dummy (i.e., placeholding) gate structures 210 disposed over the fins 204, gate spacers 212 disposed on sidewalls of each dummy gate structure 210, and source/drain (S/D) features 214 disposed over each fin 204 and interposing each dummy gate structure 210, where a p-type channel region 216P or an n-type channel region 216N is formed between the S/D features 214P or 214N, respectively. As depicted herein, the device 200 may include multiple fins 204 oriented lengthwise along the X direction and multiple dummy gate structures 210 oriented lengthwise along the Y direction, i.e., generally perpendicular to the fins 204. In the present embodiments, referring to FIG. 3, the device 200 includes a p-type metal-oxide semiconductor (PMOS) region 200P and an n-type MOS (NMOS) region 200N over the substrate 202, which provides at least one PFET and one NFET, respectively. As shown in FIG. 3 and the subsequent figures, a dotted line between the PMOS region 200P and the NMOS region 200N defines a boundary therebetween. It is noted, however, that the PMOS region 200P and the NMOS region 200N may not be disposed immediately adjacent to each as depicted in the present embodiments. The device 200 may include numerous other features such as, for example, hard mask layers, etch-stop layers, barrier layers, other suitable layers, or combinations thereof. For purpose of simplicity, intermediate steps of the method 100 are hereafter described with reference to cross-sectional views (FIGS. 3-12) of the device 200 taken along a length of the fin 204 (i.e., the dashed line A-A' in the X direction) as depicted in FIG. 2A.

The substrate 202 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer.

The fin 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 204 on the substrate 202. The etching process may include dry etching, wet etching, reactive ion etching (RIE), and/or other suitable processes.

Numerous other embodiments of methods for forming the fins 204 may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 204.

The isolation structures 208 may include silicon dioxide, silicon nitride, silicon oxynitride, a low-k dielectric material, and/or other suitable materials. The isolation structures 208 may include shallow trench isolation (STI) features. In one embodiment, the isolation structures 208 are formed by etching trenches in the substrate 202 during the formation of the fin 204. The trenches may then be filled with an isolating material described above by a deposition process, followed by a chemical mechanical planarization (CMP) process. Other isolation structures such as field oxide, local oxidation of silicon (LOCOS), and/or other suitable structures may also be implemented as the isolation structures 208. Alternatively, the isolation structures 208 may include a multi-layer structure, for example, having one or more thermal oxide layers. The isolation structures 208 may be deposited by any suitable method, such as chemical vapor deposition (CVD), flowable CVD (FCVD), spin-on-glass (SOG), other suitable methods, or combinations thereof.

Still referring to FIGS. 2A and 2B, the device 200 includes the S/D features 214 disposed in or over each fin 204 and adjacent to each dummy gate structure 210. In the present embodiments, referring to FIG. 3, the PMOS region 200P provides S/D features 214P and the NMOS region 200N provides S/D features 214N. The S/D features 214P and 214N may be formed by any suitable techniques, such as etching processes followed by one or more epitaxial processes. In one example, one or more etching processes are performed to remove portions of the fin 204 to form recesses (not shown) therein. A cleaning process may be performed to clean the recesses with a hydrofluoric acid (HF) solution and/or other suitable solutions. Subsequently, one or more epitaxial growth processes are performed to grow epitaxial features in the recesses to form the respective S/D features.

As discussed above, the S/D features 214P are suitable for forming PFETs (e.g., including an p-type epitaxial material) and the S/D features 214N are suitable for forming NFETs (e.g., including an n-type epitaxial material). The p-type epitaxial material may include one or more epitaxial layers of silicon germanium (epi SiGe) doped with a p-type dopant such as boron, germanium, indium, and/or other p-type dopants. The n-type epitaxial material may include one or more epitaxial layers of silicon (epi Si) or silicon carbon (epi SiC) doped with an n-type dopant such as arsenic, phosphorus, and/or other n-type dopant. Accordingly, the channel region 216P provided between the S/D features 214P is considered a p-type channel region and the channel region 216N provided between the S/D features 214N is considered an n-type channel region.

The device 200 further includes multiple dummy gate structures 210 disposed over the fins 204, and each dummy gate structure 210 is configured to be replaced by a high-k metal gate stack (HKMG) either in portion or in entirety during subsequent processing steps. The dummy gate structure 210 includes at least a gate electrode layer comprising polysilicon, which may be formed by first depositing a blanket layer of polysilicon and subsequently applying an anisotropic etching process to form the dummy gate structures 210. Though not depicted, the dummy gate structure 210 may optionally include an interfacial layer comprising, for example, silicon dioxide ($SiO_2$), disposed between the polysilicon layer and the fin 204, a gate dielectric layer disposed between the interfacial layer and the polysilicon layer, hard mask layers, other suitable layers, or combinations thereof. Various layers of the dummy gate structure 210 may be formed by suitable processes such as thermal oxidation, chemical oxidation, CVD, atomic layer deposition (ALD), PVD (physical vapor deposition), other suitable methods, or combinations thereof.

The device 200 may further include gate spacers 212 disposed on sidewalls of the dummy gate structure 210. In some embodiments, the gate spacers 212 include one or more of the following elements: silicon, oxygen, nitrogen, and carbon. For example, the gate spacers 212 may include a dielectric material such as silicon dioxide, silicon nitride, carbon- and/or oxygen-doped silicon nitride, silicon carbide, oxygen-doped silicon carbide, other suitable dielectric materials, or combinations thereof. The gate spacers 212 may be formed by first depositing a blanket of spacer material over the device 200, and then performing an anisotropic etching process to remove portions of the spacer material to form the gate spacers 212 on the sidewalls of the dummy gate structure 210.

Still referring to FIG. 3, the method 100 at operation 104 forms an etch-stop layer (ESL) 220 over the device 200, such that the ESL 220 is disposed over the dummy gate structures 210, the S/D features 214P, and the S/D features 214N. In the present embodiments, the ESL 220 includes a dielectric material such as silicon nitride, carbon doped-silicon nitride, aluminum oxide, aluminum nitride, other suitable materials, or combinations thereof. In one such example, the ESL 220 includes silicon nitride. Notably, the ESL 220 is free of any oxidized silicon ($Si_xO_y$, where x and y provide suitable stoichiometric ratios of silicon and oxygen) such as silicon oxide (e.g., SiO, wherein x/y is approximately 1), silicon dioxide (e.g., $SiO_2$, wherein x/y is approximately ½), other oxidized silicon compounds, or combinations thereof. In the present embodiments, the ESL 220 is deposited conformally over the device 200 by CVD, ALD, other suitable deposition methods, or combinations thereof.

Subsequently, the method 100 at operation 106 forms a silicon-containing liner 222 (hereafter referred to as Si liner 222) over the ESL 220. In the present embodiments, the Si liner 222 includes elemental silicon that may have an amorphous, single-crystalline, and/or polycrystalline microstructure. In some embodiments, the Si liner 222 consists of elemental silicon. Notably, the Si liner 222 is free of oxygen, e.g., the Si liner 222 is free of oxidized silicon. For example, the Si liner 222 is free of silicon oxide, silicon dioxide, other oxidized silicon compounds ($Si_xO_y$ as defined above), or a combination thereof. Furthermore, in the present embodiments, the Si liner 222 and the ESL 220 have different compositions, such that an etching selectivity exists between these layers. In the present embodiments, the Si liner 222 is deposited conformally over the ESL 220 by ALD, CVD, or a combination thereof. For reasons to be discussed in detail below, the present embodiments provide that the Si liner 222 is formed to a thickness t of about 5 Angstroms to about 30 Angstroms.

Now referring to FIGS. 4 and 5, the method 100 at operation 108 selectively removes a portion of the Si liner 222 deposited over the NMOS region 200N, such that a portion of the Si liner 222 remains over the PMOS region 200P only. As depicted herein, a masking element 230 is formed over the device 200 and subsequently patterned to expose the NMOS region 200N to an etching process that selectively removes the Si liner 222 without removing, or substantially removing, any layers disposed under the Si liner 222. The masking element 230 may include at least a resist (e.g., photoresist) layer and may be first deposited over the entirety of the device 200 as a blanket layer. Then, the masking element 230 may be patterned by exposure to a radiation source (e.g., extreme ultraviolet, or EUV, radiation) through a patterned mask and subsequently developed to form a patterned masking element 230 as depicted in FIGS. 4 and 5. The portion of the Si liner 222 exposed by the patterned masking element 230 may be removed by a dry etching process, a wet etching process, RIE, or combinations thereof. In an example embodiment, the portion of the Si liner 222 is removed by applying a dry etching process using a fluorine-containing plasma as an etchant. Thereafter, the patterned masking element 230 is removed from the device 200 by any suitable method such as plasma ashing and/or resist stripping. In some embodiments, the method 100 omits operation 108, i.e., the Si liner 222 remains over both the PMOS region 200P and the NMOS region 200N when performing operation 110.

As will be discussed in detail below, the Si liner 222 undergoes volumetric expansion following a subsequent oxidation treatment (discussed in detail below). In some instances, the Si liner 222 may expand about 2.5 times in volume (i.e., increase in thickness t) after being fully oxidized, i.e., after all or substantially all of the elemental silicon is converted to oxidized silicon ($Si_xO_y$) as defined above. As a result, the volumetric expansion introduces compressive stress to portions (e.g., the channel regions 216P and 216N) of the device 200 over which the Si liner 222 is disposed. Due to differences in the structure of the S/D features 214P and the S/D features 214N and the mechanical stress they exert on their respective channel regions, additional compressive stress from oxidized Si liner 222 affects the carrier mobility differently in the channel region 216P and the channel region 216N. With respect to the channel region 216P, the compressive stress positively contributes to the stress exerted by the epitaxial material (e.g., boron-doped SiGe) in the S/D features 214P, thereby increasing the carrier mobility of the channel region 216P. With respect to the channel region 216N, however, the compressive stress may negatively impact the carrier mobility of the channel region 216N, which generally increases when tensile stress, rather than compressive stress, increases. As such, the presence and subsequent oxidation of the Si liner 222 improves the performance of the PFET in the PMOS region 200P. Accordingly, embodiments of the present disclosure are directed to methods of treating the Si liner 222 to ensure that it may be fully oxidized for inducing compressive stress in the channel region 216P of the PFET as provided herein. Of course, benefits of the present embodiments are not limited to stress induction alone as will be discussed in detail below.

Furthermore, because the Si liner 222 is configured to undergo the oxidation treatment as discussed above, it is important that the thickness t (FIG. 4) of the Si liner 222 should accommodate the volumetric expansion resulting from the oxidation treatment. On one hand, if the thickness t is less than about 5 Angstroms, the effect of the volumetric expansion and the resulting compressive stress may be negligible in improving the carrier mobility of the device in the PMOS region 200P. On the other hand, if the thickness t is greater than about 30 Angstroms, the subsequent volumetric expansion may result in a layer too thick for the dimension budgeted for the device 200. In addition, when the thickness t exceeds about 30 Angstroms, it may become challenging to completely oxidize the Si liner 222, and a partially oxidized Si liner 222 may present complications for the subsequent processing steps as will be discussed in detail below.

Referring to FIG. 6, the method 100 at operation 110 forms an interlayer dielectric (ILD) layer 218 over the device 200, such that the ILD layer 218 is in contact with the Si liner 222 in the PMOS region 200P. In the present embodiments, the ILD layer 218 includes a dielectric material, such as silicon dioxide ($SiO_2$), a low-k dielectric material, tetraethylorthosilicate (TEOS), doped silicon dioxide such as borophosphosilicate glass (BPSG), fluoride-doped silicate glass (FSG), phosphosilicate glass (PSG), boron-doped silicate glass (BSG), other suitable dielectric materials, or combinations thereof. In some embodiments, the ILD layer 218 includes excess oxygen atoms 240 as indicated in FIG. 6. The ILD layer 218 may include a multi-layer structure or a single-layer structure and may be formed by a deposition process such as CVD, FCVD, SOG, other suitable methods, or combinations thereof. For embodiments in which the ILD layer 218 is formed by FCVD, a precursor such as trisilylamine ($N(SiH_3)_3$) is deposited and then cured using an radiation source such as ultraviolet (UV) light to convert the precursor to oxidized silicon (e.g., silicon oxide), thereby hardening at least a portion of the ILD layer 218. The curing process may be omitted if other deposition methods are employed to form the ILD layer 218.

Still referring to FIG. 6, the method 100 at operation 112 performs an annealing (or curing) treatment to harden (or further harden if a curing process has been previously implemented at operation 110) the ILD layer 218. In the present embodiments, the annealing process at operation 112 ensures that any silicon oxide in the as-deposited ILD layer 218 is transformed into silicon dioxide. Furthermore, as provided herein, the annealing process is configured to oxidize a portion of the Si liner 222, resulting in a partially oxidized Si liner 222A. In other words, a portion of the Si liner 222 remains unoxidized after performing the annealing process. The annealing treatment may be performed at a temperature configured to provide enough thermal energy to initiate oxidation of silicon in the Si liner 222 but not to generate excessive heat that may damage other components of the device 200. In some embodiments, the annealing treatment is performed at a temperature of about 400 degrees Celsius to about 600 degrees Celsius. Thus, the annealing treatment provides thermal energy for both hardening the ILD layer 218 and mobilizing the excess oxygen atoms 240 in the ILD layer 218 to react with the elemental silicon of the Si liner 222, thereby partially oxidizing the Si liner 222 to form silicon oxide and/or silicon dioxide. In the present embodiments, the Si liner 222 is not fully oxidized by the annealing treatment at operation 112.

As discussed above, the Si liner 222 undergoes volumetric expansion as a result of the (partial) oxidation process at operation 112, thereby exerting compressive stress to portions of the device 200 disposed thereunder. In the present embodiments, as indicated by arrows pointing in opposite directions in FIG. 6, the partially oxidized Si liner 222A exerts compressive stress 250 on the S/D features 214P, which subsequently exerts compressive stress on the channel region 216P, thereby increasing the carrier mobility of the PFET. Notably, since the Si liner 222 has been removed at operation 108, the NMOS region 200N is free of any partially oxidized Si liner 222A and thus no compressive stress is experienced in the channel region 216N. For embodiments in which the Si liner 222 has not been removed at operation 108, the partial oxidation of the Si liner 222 at operation 112 may also exert compressive stress in the channel region 216N. However, because the carrier mobility of the channel region 216N is generally improved by application of tensile stress, any compressive stress applied to the channel region 216N may reduce the carrier mobility of the NFET. As such, removing the Si liner 222 at operation 108 serves to boost the overall performance of the device 200 (a combination of the devices in the PMOS region 200P and the NMOS region 200N).

In the present embodiments, it is understood that the concentration of the excess oxygen atoms 240 in the ILD layer 218 prior to performing operation 112 may not be sufficient to allow complete oxidation of the Si liner 222. According to some embodiments of the present disclosure, a silicon liner that includes at least some unoxidized elemental silicon may adversely affect the etching of portions of the device 200 when forming an S/D contact during subsequent processing steps (discussed in detail below). It is further understood that the amount of compressive stress applied to the channel region 216P varies with the degree of volumetric expansion of the Si liner 222, which corresponds to the extent of oxidation of the Si liner 222. As such, it is desirable to obtain a fully oxidized Si liner in order to maximize the magnitude of the compressive stress 250 exerted on the channel region 216P. In some embodiments, the method 100 omits operation 112, such that the Si liner 222 remains unoxidized until subsequent implantation and baking processes are implemented as discussed in detail below.

Thereafter, referring to FIG. 7, the method 100 at operation 114 planarizes a top surface of the device 200, thereby exposing the dummy gate structures 210. In the present embodiments, the method 100 performs a CMP process along a top surface of the dummy gate structures 210, which subsequently removes portions of the partially oxidized Si liner 222A and portions of the ESL 220. As depicted herein, after performing operation 114, portions of the partially oxidized Si liner 222A and ESL 220 remain over the S/D features 214P and 214N as well as over the gate spacers 212.

Figure 8:
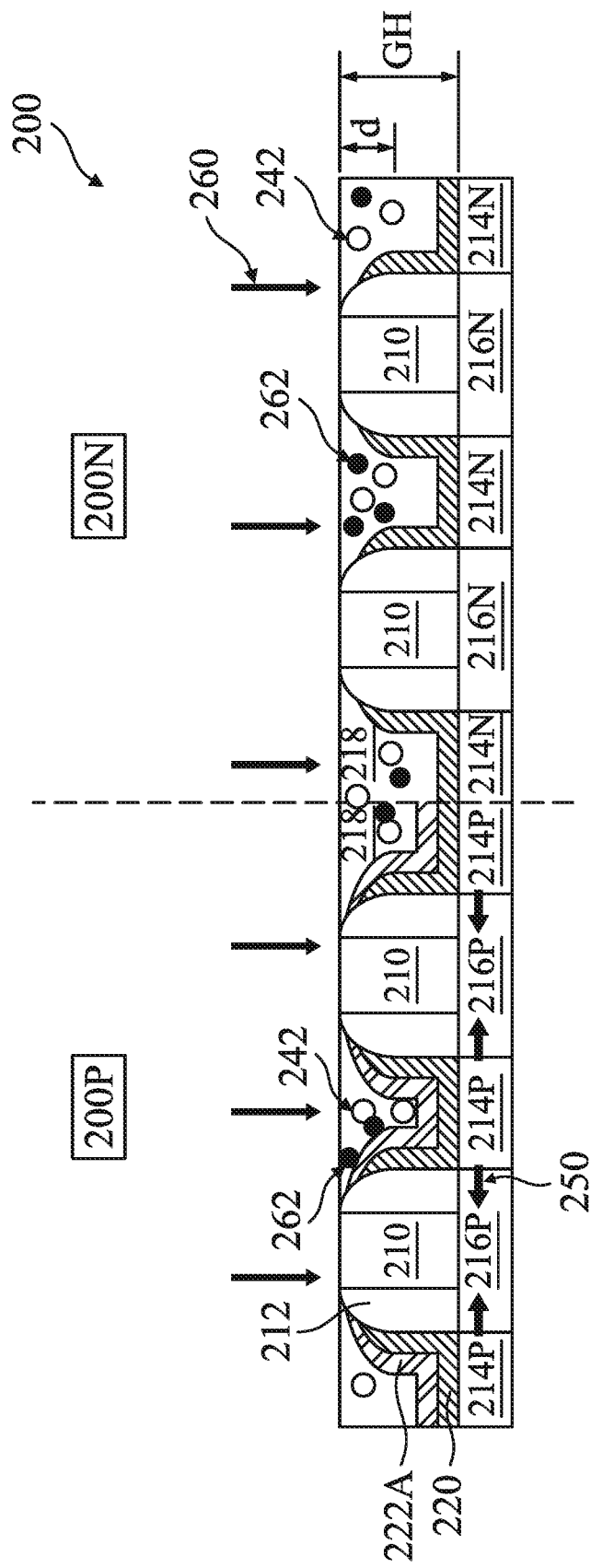

Referring now to FIG. 8, the method 100 at operation 116 performs an implantation process 260 to the device 200. In the present embodiments, bombarding the ILD layer 218, which includes silicon dioxide ($SiO_2$), with a dopant species 262 causes the bond between silicon and oxygen of the silicon dioxide to break, thereby freeing oxygen atoms 242 to diffuse through the ILD layer 218. As provided herein, the dopant species 262 may include non-metallic elements such as nitrogen, silicon, germanium, or combinations thereof. Of course, other non-metallic dopant species may also be applicable for performing the implantation process 260 so long as the following criteria are satisfied. First, the size of such dopant species 262 should be substantially similar to that of silicon, which is a major component of the ILD layer 218. On one hand, if the dopant species 262 is much smaller than silicon in size, the dopant species 262 may completely penetrate through the ILD layer 218 and impinge underlying components of the device 200 (e.g., the S/D features 214P, the S/D features 214N, the channel region 216P, and/or the channel region 216N). On the other hand, if the dopant species 262 is much larger than silicon in size, the dopant species 262 may inadvertently cause structural damage to the ILD layer 218. Second, since at least a portion of the dopant species 262 remains in the ILD layer 218 after performing the implantation process 260, the dopant species 262 should be free of any metallic elements to avoid forming conductive paths in the ILD layer 218 and cause adverse effects to the performance of the device 200.

Any suitable implantation process (e.g., ion implantation) may be applicable to the present embodiments. Parameters such as energy of implantation, dosage of the dopant species 262, angle of implantation, and/or other suitable parameters may be adjusted to achieve the implantation results at operation 116. In some embodiments, a penetration depth d of the dopant species 262 is no greater than about one half of a height GH of the dummy gate structures 210 to prevent the dopant species 262 from impacting the underlying components of the device 200, the penetration depth d being measured from a top surface of the dummy gate structures 210. In some embodiments, the penetration depth d is controlled by adjusting the energy of implantation. For example, increasing the energy of implantation increases the penetration depth d, and decreasing the energy of implantation decreases the penetration depth d. In some examples, the energy of implantation may be about 5 keV to about 50 keV; of course, this range of energy is for illustrative purposes only and may be adjusted according to the GH of the device 200. It is understood that increasing the GH of the device 200 generally requires an increased energy of implantation to achieve the results discussed herein.

In some embodiments, the dosage of the dopant species 262 is about $6.6E14$ $cm^{-2}$ to about $3.0E15$ $cm^{-2}$, which results in a concentration of about $1E20$ $cm^{-3}$, or about 0.5% by weight, to about $5E20$ $cm^{-3}$, or about 2% by weight, respectively, in the ILD layer 218. On one hand, if the concentration of the dopant species 262 falls below about 0.5%, the effect of breaking the bond between silicon and oxygen would be diminished, leading to less oxygen atoms available for diffusion through the ILD layer 218. On the other hand, if the concentration of the dopant species 262 is above about 2%, the excess dopant species 262 would inadvertently impact the structures and performance of the ILD layer 218 and/or any components disposed thereunder.

Figure 9:
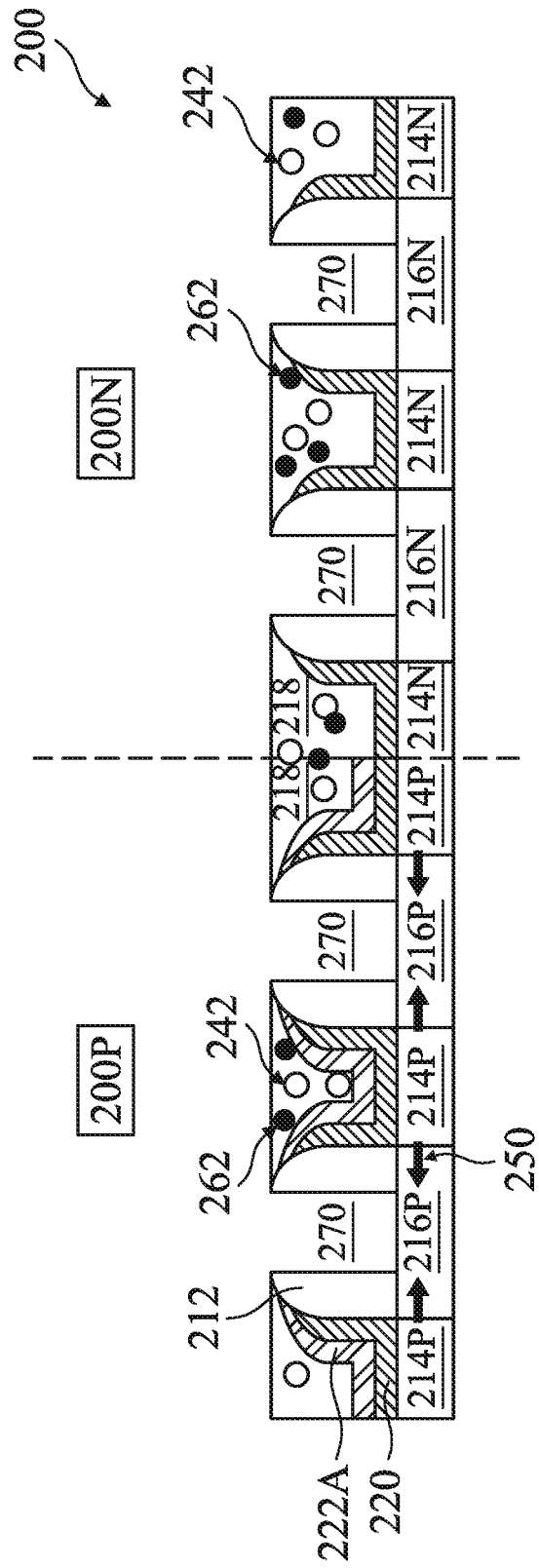

Referring to FIG. 9, the method 100 at operation 118 removes the dummy gate structures 210 to form gate trenches 270. The method 100 selectively removes the dummy gate structures 210 without removing or substantially removing other portions of the device 200. In some embodiments, a patterned masking element (not depicted) is formed over the device 200 to expose the dummy gate structures 210, which are subsequently removed by any suitable etching process, such as a dry etching process. The patterned masking element may then be removed from the device 200 by any suitable method such as plasma ashing and/or resist stripping. In some embodiments, the dopant species 262 remain in the ILD layer 218, though they generally are chemically inert with respect to the various components of the device 200. For this reason, the dopant species 262 are omitted in the subsequent figures for clarity purposes. In some embodiments, an interfacial layer (not depicted) remains in the gate trenches 270 after removing the dummy gate structures 210 and subsequently becomes a portion of the HKMG formed thereafter.

Figure 10:
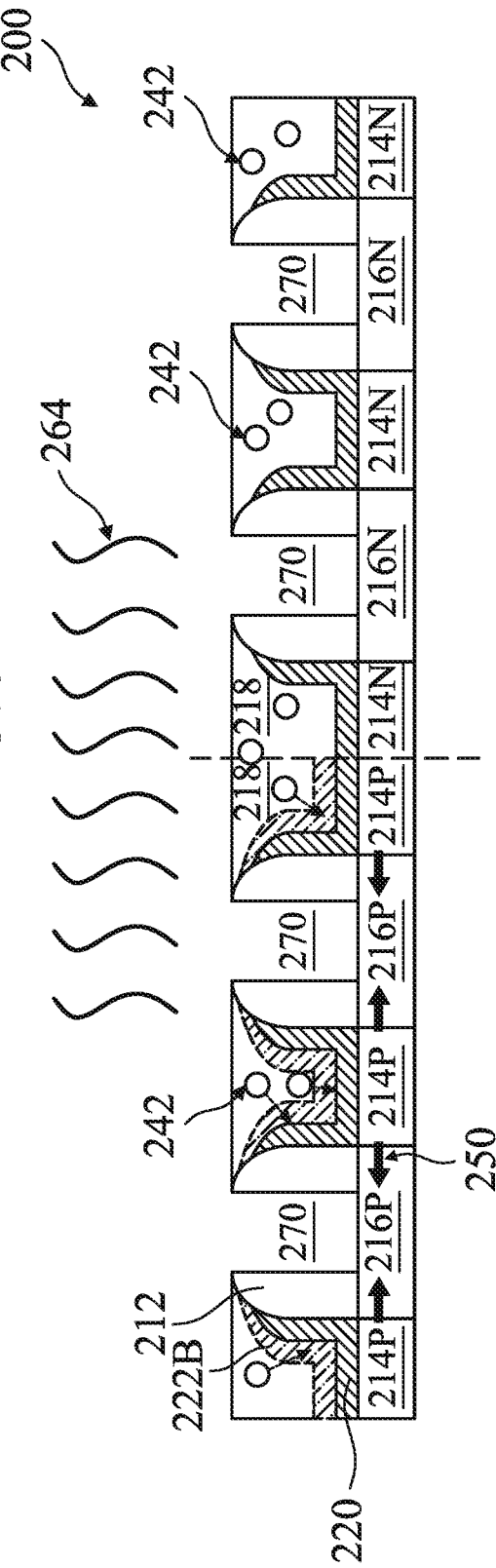

Referring to FIG. 10, the method 100 at operation 120 implements a baking process 264 to the device 200. In the present embodiments, the baking process 264 is configured to promote diffusion of the oxygen atoms 242 into the partially oxidized Si liner 222A and transform the partially oxidized Si liner 222A into a fully oxidized Si liner 222B in the PMOS region 200P. In some embodiments, as indicated by dotted arrows shown in FIG. 10, the oxygen atoms 242 are driven by the baking process 264 into the partially oxidized Si liner 222A and configured to react with any remaining elemental silicon to form an oxidized silicon compound $Si_xO_y$, as defined above. In the present embodiments, x/y is approximately 1 or ½, i.e., the fully oxidized Si liner 222B includes silicon oxide, silicon dioxide, or a combination thereof. In some embodiments, the baking process 264 further oxidizes a portion of the silicon oxide present in the partially oxidized Si liner 222A to form silicon dioxide. In addition, the baking process 264 may also cause some of the excess oxygen atoms 240 (not depicted in FIG. 10) and/or the oxygen atoms 242 in the PMOS region 200P and/or the NMOS region 200N to outgas and escape the device 200. In some embodiments, the amount of outgassed oxygen atoms from the PMOS region 200P is less than that that from the NMOS region 200N due to the diffusion of the oxygen atoms 242 into the partially oxidized Si liner 222A in the PMOS region 200P.

Figure 13:
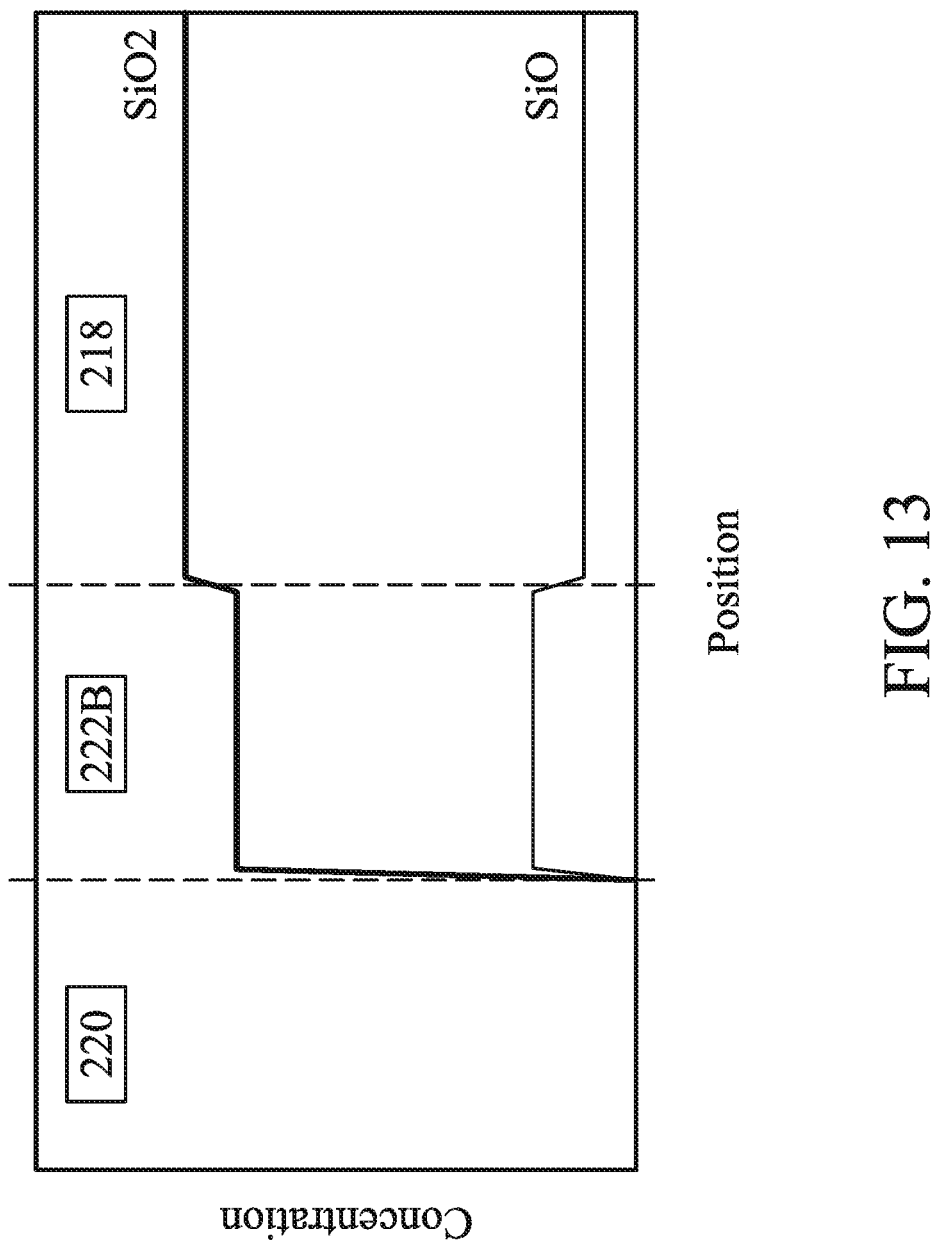
FIG. 13 shows an example concentration profile in a portion of the semiconductor structure of FIGS. 2A and/or 2B after implementing an embodiment of the method of FIGS. 1A and 1B according to aspects of the present disclosure.

Concentration profiles of silicon oxide and silicon dioxide across the ESL 220, the fully oxidized Si liner 222B, and the ILD layer 218 are depicted in FIG. 13 to better illustrate embodiments of the present disclosure. In the present embodiments, the fully oxidized Si liner 222B includes a combination of silicon oxide and silicon dioxide. In some embodiments, the concentration of silicon dioxide is greater in the ILD layer 218 than in the fully oxidized Si liner 222B, and the concentration of silicon oxide is greater in the fully oxidized Si liner 222B than in the ILD layer 218. In other words, the concentration of silicon oxide SiO in the fully oxidized Si liner 222B decreases toward an interface (represented by the dotted line) between the fully oxidized Si liner 222B and the ILD layer 218, while the concentration of silicon dioxide increases toward the same interface. In some embodiments, the concentration of silicon dioxide is greater than the concentration of silicon oxide in the fully oxidized Si liner 222B. Furthermore, the ESL 220 may be substantially free of any silicon oxide or silicon dioxide. Still referring to FIG. 13, in some embodiments, such changes in concentration is gradual at the interface, as indicated by the dotted line between the fully oxidized Si liner 222B and the ILD layer 218 in FIG. 11.

Importantly, in the present embodiments, the fully oxidized Si liner 222B is substantially free of any elemental (i.e., unoxidized) silicon. In this regard, the amount of the elemental silicon in the fully oxidized Si liner 222B may be insignificant enough such that it does not adversely impact the subsequent etching of a contact trench as discussed above. As a non-limiting example, the amount of unoxidized, elemental silicon may be less than about 0.1% by weight in the fully oxidized Si liner 222B.

It is understood that the baking process 264 also causes the oxygen atoms 242 to diffuse into the interfacial layer (e.g., interfacial layer 282 as depicted in FIGS. 11 and 12) that remains in the gate trenches 270 after removing the dummy gate structures 210, causing regrowth of the interfacial layer. If a substantially amount of the oxygen atoms 242 diffuses into the interfacial layer, the excess regrowth may lead to a thicker interfacial layer and consequently increase resistance of the device 200. In the present embodiments, however, the Si liner 222 (or the partially oxidized Si liner 222A) reduces the amount of the oxygen atoms 242 present by reacting with them to form one or more oxidized silicon compounds, thereby lowering the extent of the regrowth of the interfacial layer.

In the present embodiments, the baking process 264 is implemented at a temperature of about 400 degrees Celsius to about 650 degrees Celsius, a temperature range configured to ensure proper device performance. On one hand, if the temperature is less than about 400 degrees Celsius, the thermal energy would not have been sufficient to cause the diffusion of the oxygen atoms 242 into (and the subsequent oxidation of) the partially oxidized Si liner 222A. On the other hand, if the temperature is greater than about 650 degrees Celsius, excess heat may de-activate the dopants in the S/D features 214P and 214N, thereby degrading the performance of the device 200. In some embodiments, the baking process 264 is implemented at a temperature higher than that of the annealing process discussed above with reference to operation 112 and FIG. 6, which only partially oxidizes the Si liner 222. In some examples, the baking process 264 may be implemented for about 0.3 hour to about 2 hours in duration. It is understood that the duration of the baking process 264 is not limited to this range and may vary according to a thickness of the ILD layer 218.

Thereafter, referring to FIG. 11, the method 100 at operation 122 forms an HKMG 280 in each gate trench 270. Each HKMG 280 may include an interfacial layer 282 disposed over the channel regions 216P and 216N, a high-k dielectric layer (not depicted) disposed over the interfacial layer 282, and a metal gate stack 284 disposed over the high-k dielectric layer. The metal gate stack may further include at least one work function metal layer (not depicted) and a bulk conductive layer (not depicted) disposed thereover. The interfacial layer 282 may be formed as a part of the HKMG 280 at operation 122 or, alternatively, may be formed before depositing the dummy gate structure 210 at operation 102 and may remain in the gate trench 270 after the dummy gate structure 210 is removed at operation 118. In the present embodiments, the former scenario is depicted as a non-limiting example. The work function metal layer may be a p-type or an n-type work function metal layer. Example work function metals may include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable work function materials, or combinations thereof. The bulk conductive layer may include Cu, W, Al, Co, Ru, other suitable metals, or combinations thereof. The HKMG 280 may further include other layers (not depicted), such as a capping layer, a barrier layer, other suitable layers, or combinations thereof. Various layers of the HKMG 280 may be deposited by any suitable method, such as chemical oxidation, thermal oxidation, ALD, CVD, PVD, plating, other suitable methods, or combinations thereof.

Referring to FIG. 12, the method 100 at operation 124 forms an S/D contact 290 over the S/D features 214P and/or 214N, where each S/D contact 290 is configured to interconnect the S/D features 214P/214N to subsequently-formed vias, conductive lines, and/or other interconnect structures. The S/D contacts 290 may be formed by first depositing an ILD layer 288 over the ILD layer 218, forming a patterned masking element (not depicted) that exposes a portion of the device 200 above the S/D features 214P/214N, etching to remove the exposed portion to form a contact trench (not depicted), depositing a conductive material in the contact trench, and subsequently planarizing a top surface of the device 200 to form the S/D contacts 290. The ILD layer 288 may be substantially similar to the ILD layer 218 and may be formed by any suitable methods discussed herein. The conductive material may include Cu, W, Al, Co, Ru, other suitable metals, or combinations thereof and may be formed by CVD, PVD, plating, other suitable methods, or combinations thereof. As depicted herein, portions of the fully oxidized Si liner 222B and the ESL 220 remain on sidewalls of the S/D contact 290 in the PMOS region 220P, while only portions of the ESL 220 remain on the sidewalls of the S/D contact 290 in the NMOS region 200N. Thereafter, the method 100 at operation 126 may implement additional processing steps to the device 200. For example, the method 100 may form additional contact features over the device 200 including, for example, gate contacts over the HKMGs 280, vertical interconnect features such as vias, horizontal interconnect features such as metal lines, other interconnect structures, or combinations thereof.

In the present embodiments, forming the S/D contact 290 includes etching portions of the ILD layers 288 and 218 as well as portions of the fully oxidized Si liner 222B and the ESL 220 to form the contact trench as discussed above. Generally, the etching process is configured to remove dielectric materials such as silicon nitride, silicon oxide, and/or silicon dioxide included in the layers (e.g., the ESL 220, the fully oxidized Si liner 222B, the ILD layer 218, and the ILD layer 288) disposed over the S/D features 214P/214N using a common etchant. However, if the partially oxidized Si liner 222A, rather than the fully oxidized Si liner 222B, remains in the device 200 before forming the S/D contact 290, the elemental silicon therein would present etching selectivity with respect to the dielectric materials in the ESL 220 as well as the ILD layers 218 and 288. In one such instance, as depicted in a profile 292 of dotted lines in FIG. 12, the presence of elemental (i.e., unoxidized) silicon limits the extent of etching and reduces a width of a bottom portion of the contact trench. Consequently, the contact area between the S/D contact 290 and the S/D features 214P/214N is reduced, inadvertently increasing the contact resistance of the device 200. The embodiments provided herein address this challenge by performing the implantation process 260 followed by the baking process 264 to ensure that all, or substantially all, of the elemental silicon is fully oxidized in the Si liner 222, thereby forming the fully oxidized Si liner 222B as discussed above.

Although not intended to be limiting, one or more embodiments of the present disclosure provide many benefits to a semiconductor device and the formation thereof. The present disclosure provides methods of introducing stress (e.g., compressive stress) to a p-type channel region of a semiconductor device. In the present embodiments, the compressive stress is introduced by depositing a silicon liner over a p-type channel region and subjecting the silicon liner to a series of implantation and thermal treatments aimed to fully oxidize the elemental silicon in the silicon liner. In some embodiments, the implantation treatment is configured to release oxygen atoms from the silicon dioxide included in an ILD layer formed over the silicon liner, and the thermal treatment then facilitates the diffusion of the oxygen atoms into the silicon liner, which is subsequently oxidized by the oxygen atoms. As provided herein, the oxidized silicon liner undergoes volumetric expansion, which in turn exerts compressive stress to the p-type channel region of the device, thereby increasing the compressive stress experienced by the p-type channel region for improved carrier mobility.

In one aspect, the present disclosure provides a method that includes forming a silicon liner over a semiconductor device, which includes a dummy gate structure disposed over a substrate and S/D features disposed adjacent to the dummy gate structure, where the dummy gate structure traverses a channel region between the S/D features. The method further includes forming an ILD layer over the silicon liner, which includes elemental silicon, introducing a dopant species to the ILD layer, and subsequently removing the dummy gate structure to form a gate trench. Thereafter, the method proceeds to performing a thermal treatment to the doped ILD layer, thereby oxidizing the silicon liner, and forming a metal gate stack in the gate trench and over the oxidized silicon liner.

In another aspect, the present disclosure provides a semiconductor structure that includes S/D features disposed over a semiconductor substrate, a metal gate stack disposed between the S/D features, where the metal gate stack traverses a channel region between the S/D features, gate spacers disposed on sidewalls of the metal gate stack, and an ESL disposed over the gate spacers and the S/D features. The semiconductor structure further includes an oxide liner disposed on the ESL, where the oxide liner includes silicon oxide and silicon dioxide, and an ILD layer disposed on the oxide liner, where composition of the ILD layer is different from composition of the oxide liner.

In yet another aspect, the present disclosure provides a semiconductor structure that includes a first semiconductor device and a second semiconductor device disposed over a substrate. Specifically, the first semiconductor device includes first S/D features disposed over the substrate, a first HKMG disposed over the substrate, where the first HKMG traverses a first channel region between the first S/D features and the first channel region is of p-type, first gate spacers disposed on sidewalls of the first HKMG, an ESL disposed on the first gate spacers and the first S/D features, an oxide layer disposed on the ESL, where the oxide layer exerts compressive stress on the first channel region, and an ILD layer disposed on the oxide layer, where composition of the ILD layer differs from composition of the oxide layer. Furthermore, the second semiconductor device includes second S/D features disposed over the substrate, a second HKMG disposed over the substrate, where the second HKMG traverses a second channel region between the second S/D features and where the second channel region is of n-type, second gate spacers disposed on sidewalls of the second HKMG, the ESL disposed on the second gate spacers and the second S/D features, and the ILD layer disposed over the ESL.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   source/drain (S/D) features disposed over a semiconductor substrate;
   a metal gate stack disposed between the S/D features, wherein the metal gate stack traverses a channel region between the S/D features;
   gate spacers disposed on sidewalls of the metal gate stack;
   an etch-stop layer (ESL) disposed over the gate spacers and the S/D features;
   an oxide liner above the ESL, wherein the oxide liner includes silicon oxide (SiO) and silicon dioxide ($SiO_2$); and
   an interlayer dielectric (ILD) layer disposed on the oxide liner, wherein composition of the ILD layer is different from composition of the oxide liner,
   wherein a portion of the ESL directly above the S/D feature is in direct contact with a bottommost surface of the oxide liner.

2. The semiconductor structure of claim 1, wherein a concentration of SiO is greater in the oxide liner than in the ILD layer.

3. The semiconductor structure of claim 1, wherein a concentration of $SiO_2$ is greater in the ILD layer than in the oxide liner.

4. The semiconductor structure of claim 1, wherein the oxide liner is free of silicon in elemental form.

5. The semiconductor structure of claim 1, wherein the channel region is a p-type channel region, and wherein the oxide liner exerts compressive stress on the p-type channel region.

6. The semiconductor structure of claim 1, wherein the S/D features are p-type S/D features disposed in a p-type device region of the semiconductor substrate, wherein the metal gate stack is a first metal gate stack, and wherein the channel region is a p-type channel region, the semiconductor structure further comprising:
   n-type S/D features disposed in an n-type device region of the semiconductor substrate;
   a second metal gate stack disposed between the n-type S/D features, wherein the second metal gate stack traverses an n-type channel region between the n-type S/D features;
   second gate spacers disposed on sidewalls of the second metal gate stack;
   the ESL disposed on the second gate spacers and the n-type S/D features; and
   the ILD layer disposed on the ESL, such that the n-type device region is free of the oxide liner.

7. The semiconductor structure of claim 1, wherein the S/D features are p-type S/D features disposed in a p-type device region of the semiconductor substrate, wherein the metal gate stack is a first metal gate stack, and wherein the channel region is a p-type channel region, the semiconductor structure further comprising:
   n-type S/D features disposed in an n-type device region of the semiconductor substrate;
   a second metal gate stack disposed between the n-type S/D features, wherein the second metal gate stack traverses an n-type channel region between the n-type S/D features;
   second gate spacers disposed on sidewalls of the second metal gate stack;
   the ESL disposed over the second gate spacers and the n-type S/D features;
   the oxide liner above the ESL; and
   the ILD layer disposed on the oxide liner.

8. A semiconductor structure, comprising:
   a first semiconductor device disposed in a p-type metal-oxide semiconductor (PMOS) region over a substrate, wherein the first semiconductor device includes:
   first source/drain (S/D) features disposed in the PMOS region over the substrate;
   a first high-k metal gate stack (HKMG) disposed over the substrate, wherein the first HKMG traverses a first channel region between the first S/D features, and wherein the first channel region is of p-type; and first gate spacers disposed on sidewalls of the first HKMG;

a second semiconductor device disposed in an n-type metal-oxide semiconductor (NMOS) region over the substrate, wherein the second semiconductor device includes:

second S/D features disposed over the substrate;

a second HKMG disposed over the substrate, wherein the second HKMG traverses a second channel region between the second S/D features, and wherein the second channel region is of n-type; and second gate spacers disposed on sidewalls of the second HKMG;

an etch-stop layer (ESL) having a first portion disposed on and extending along a top surface of the first S/D features and a second portion disposed on and extending along a top surface of the second S/D features;

an oxide layer above the first portion of the ESL; and an interlayer dielectric (ILD) layer disposed on the oxide layer, wherein composition of the ILD layer differs from composition of the oxide layer, wherein the first portion of the ESL directly interfaces with the oxide layer and the second portion of the ESL directly interfaces with the ILD layer.

9. The semiconductor structure of claim 8, wherein the oxide layer includes silicon oxide at a first concentration and silicon dioxide at a second concentration that is greater than the first concentration.

10. The semiconductor structure of claim 8, wherein the oxide layer is disposed between the ESL and the ILD layer.

11. The semiconductor structure of claim 8, wherein the ILD layer directly contacts the ESL.

12. The semiconductor structure of claim 8, wherein the ILD layer includes a greater amount of silicon dioxide than the oxide layer.

13. The semiconductor structure of claim 8, wherein the oxide layer exerts compressive stress on the first channel region.

14. A semiconductor structure, comprising:

a semiconductor fin protruding from a substrate;

source/drain (S/D) features disposed in the semiconductor fin;

a metal gate structure interposed between the S/D features;

a dielectric spacer disposed on and in contact with a sidewall of the metal gate structure;

a dielectric liner disposed over the dielectric spacer and the S/D features, wherein the dielectric liner includes oxidized silicon;

an etch-stop layer (ESL) disposed between the dielectric spacer and the dielectric liner, wherein a bottommost surface of the dielectric liner is in direct contact with a top surface of the ESL, and wherein a topmost surface of the ESL is below a topmost surface of the metal gate structure and below a topmost surface of the dielectric liner; and an interlayer dielectric (ILD) layer disposed over the dielectric liner, wherein composition of the ILD layer is different from composition of the dielectric liner.

15. The semiconductor structure of claim 14, wherein the ESL is free of any oxidized silicon.

16. The semiconductor structure of claim 14, wherein the dielectric liner includes a mixture of silicon oxide (SiO) and silicon dioxide ($SiO_2$).

17. The semiconductor structure of claim 16, wherein an amount of the $SiO_2$ is greater than an amount of the SiO in the dielectric liner.

18. The semiconductor structure of claim 16, wherein an amount of $SiO_2$ in the ILD layer is greater than an amount of $SiO_2$ in the dielectric liner.

19. The semiconductor structure of claim 14, wherein the dielectric liner increases compressive stress exerted by the S/D features on a channel region traversed by the metal gate structure.

20. The semiconductor structure of claim 14, wherein the ILD layer directly contacts the dielectric liner.

* * * * *